United States Patent [19]

Ashuri

[11] Patent Number: 5,818,263
[45] Date of Patent: Oct. 6, 1998

[54] METHOD AND APPARATUS FOR LOCATING AND IMPROVING RACE CONDITIONS IN VLSI INTEGRATED CIRCUITS

[75] Inventor: Roni Ashuri, Zichron Yaakov, Israel

[73] Assignee: Intel Corporation, Santa Clara, Calif.

[21] Appl. No.: 536,435

[22] Filed: Sep. 29, 1995

[51] Int. Cl.⁶ .................................................. H03K 19/00
[52] U.S. Cl. .............................. 326/93; 326/101; 326/21; 326/269; 326/263; 326/293; 326/297
[58] Field of Search .................................. 326/93, 94, 95, 326/98, 21, 101, 47, 16; 327/262, 263, 268, 269, 270, 272, 293, 295, 297; 364/490–1; 371/28, 22.1

[56] References Cited

U.S. PATENT DOCUMENTS

| | | | |
|---|---|---|---|
| 3,633,100 | 1/1972 | Hellwell | 326/104 |
| 4,639,615 | 1/1987 | Lee | 327/297 |
| 4,686,455 | 8/1987 | Lassman | 371/25 |
| 4,939,389 | 7/1990 | Cox | 326/16 |
| 5,013,942 | 5/1991 | Nishimura | 327/297 |
| 5,107,153 | 4/1992 | Osaki | 307/601 |
| 5,122,679 | 6/1992 | Ishii | 327/295 |
| 5,140,184 | 8/1992 | Hamamoto | 326/93 |
| 5,206,861 | 4/1993 | Hannon | 371/28 |
| 5,414,381 | 5/1995 | Nelson | 327/295 |
| 5,430,397 | 7/1995 | Itoh et al. | 326/101 |
| 5,578,938 | 11/1996 | Kazami | 326/16 |

OTHER PUBLICATIONS

Chen, John Y., "CMOS Devices and Technology for VLSI", copyright 1990 (no month available) by Prentice–Hall, Inc.; pp. 100–103.

*Primary Examiner*—Edward P. Westin
*Assistant Examiner*—Richard Roseen
*Attorney, Agent, or Firm*—Blakely, Sokoloff, Taylor & Zafman

[57] ABSTRACT

An improved local clock driver for locating race conditions within a integrated digital circuit. Highly integrated digital circuits have many local circuits and each local circuit has a local clock driver. The local clock driver strengthens and distributes a clock signal within the local circuit. The improved local clock driver introduces a controllable delay circuit in all the local clock drivers of the digital integrated circuit. By selectively delaying each local clock driver, clock skew problems that cause race conditions can be located. To compensate for such race conditions caused by clock skew problems, the delay circuit can be turned on in the receiving local block circuit.

8 Claims, 5 Drawing Sheets

METHOD AND APPARATUS FOR LOCATING AND IMPROVING RACE CONDITIONS IN VLSI INTEGRATED CIRCUITS

FIELD OF THE INVENTION

The present invention is in the field of digital semiconductor electronic devices. Specifically, the present invention comprises a circuit and method for locating race conditions in digital semiconductor devices and improving those race conditions.

BACKGROUND OF THE INVENTION

Modern microprocessors with superscalar and pipeline designs require large die surface areas to implement. Furthermore, modern microprocessors are running at faster and faster clock speeds. The combined effect of having large die surface area and an extremely fast clock speed is making it difficult to distribute a clock signal uniformly throughout a microprocessor chip with minimal clock skew and clock delay.

In a very large integrated circuit device, such as a microprocessor, a main clock signal is distributed to several subblocks using subblock clock drivers. Within those subblocks small local drivers drive the clock signal to small local circuits. Since the clock signal must travel through different distances to get to the different subblocks and then travel through different logic circuits within the different subblocks, the clock signals within the different subblocks often become skewed.

If a data signal from one subblock, driven using a first local clock line is sent to a different subblock that is clocked using a second local clock line, problems may occur. Specifically, if the two clock lines do not match closely then the data signal will be clocked too early or too late. For example, if the clock line from the second subblock is slower than the clock line from the first subblock then the data signal from the first subblock will be generated and removed before the second subblock is able to sample the data signal line from the first subblock. This situation is referred to as a "race condition."

Race conditions can cause the wrong data value to be read when a data signal is sampled since the data signal is removed before it is sampled. Thus race conditions can cause an integrated circuit to not function properly. Thus, it would also be desirable to be able to locate clock skew problems in an integrated circuit that cause race conditions. Furthermore, it would be desirable to eliminate such problems.

SUMMARY AND OBJECTS OF THE INVENTION

It is thus an object of the present invention to locate race condition problems caused by clock skew in different subblocks within an integrated circuit.

It is a further object of the present invention to compensate the clock skew that causes race conditions.

These and other objectives are accomplished by the improved local clock driver of the present invention. Each local circuit within a very highly integrated digital circuit has a local clock driver. The local clock driver strengthens and distributes a clock signal within the local circuit. The present invention introduces a controllable delay circuit in all the local clock drivers of a digital integrated circuit. By selectively enabling the delay of each local dock circuit, race conditions caused by clock skew problems can be located.

To compensate for the race conditions, the delay circuit can be turned on in a local clock driver that transmits the data signal.

BRIEF DESCRIPTION OF THE DRAWINGS

The objects, features, and advantages of the present invention will be apparent from the following detailed description of the preferred embodiment of the invention with references to the following drawings.

DETAILED DESCRIPTION

A method and apparatus for detecting race condition problems within digital integrated circuits is disclosed. In the following description, for purposes of explanation, specific nomenclature is set forth to provide a thorough understanding of the present invention. However, it will be apparent to one skilled in the art that these specific details are not required in order to practice the present invention. In other instances, well known circuits and devices are shown in block diagram form in order not to obscure the present invention.

Clock Signal Distribution

Figure 1A:
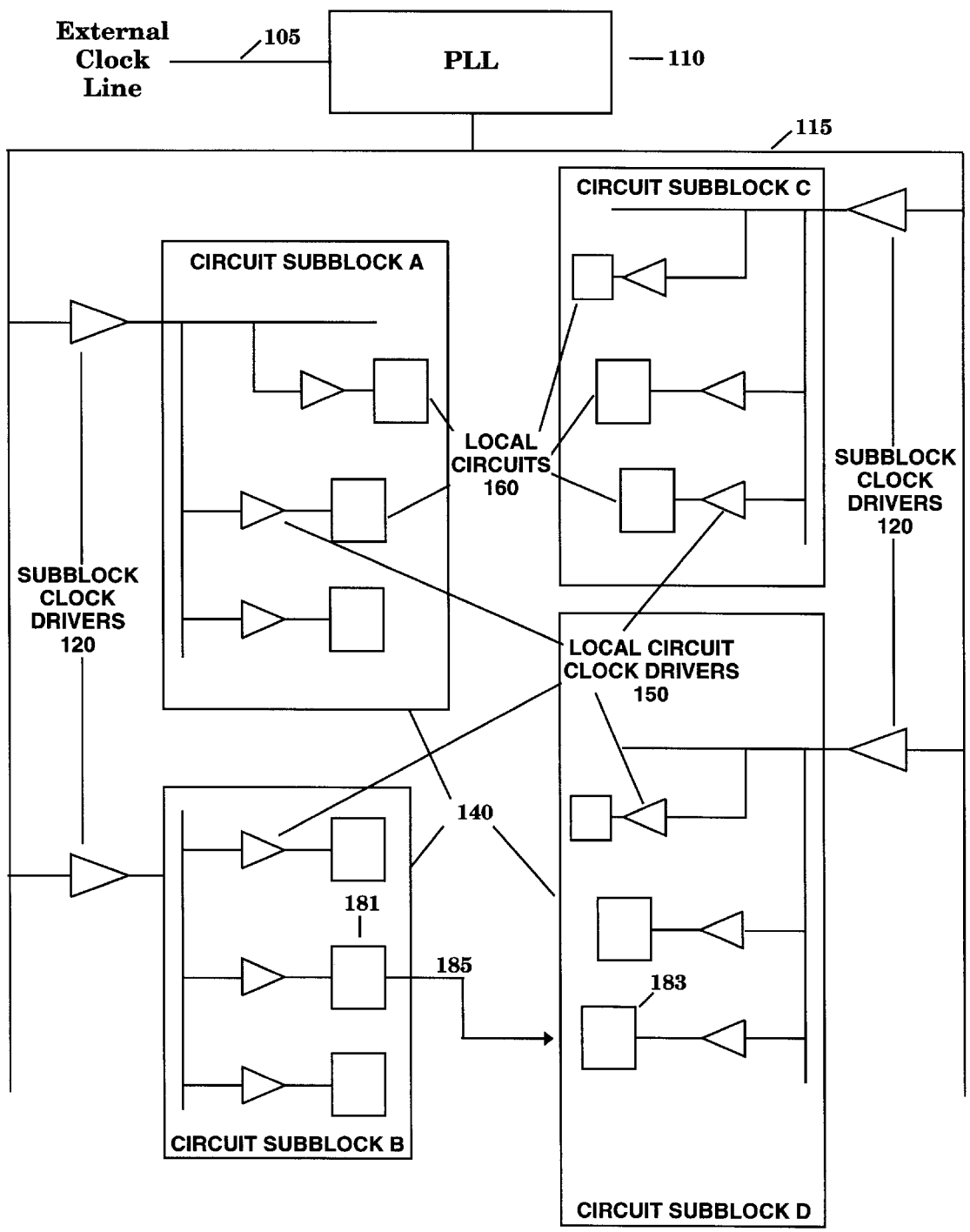
FIG. 1a illustrates a block diagram of a highly integrated digital integrated circuit.

FIG. 1a illustrates a block diagram of a typical clock distribution system for use within a digital integrated circuit. An external clock signal driven by a crystal or other means is introduced into the integrated circuit on line 105. The external clock line 105 enters a phase lock loop circuit 110 or other clock generator that drives a main clock signal 115 within the integrated circuit.

The digital integrated circuit of FIG. 1a is divided into several circuit subblocks 140. Each circuit subblock 140 provides some functionality for the integrated circuit. The main clock signal 115 is distributed to several subblock clock drivers 120 that drive the clock signal within the various circuit subblocks 140. The subblock clock drivers 120 strengthen the clock line signal in order to drive a large fan-out of local circuits within each subblock. Within each subblock, the strengthened clock line drives several local clock drivers 150. Each local clock driver 150 drives a local circuit 160.

Within a digital integrated circuit, data is often shared between the various local circuits. The various local circuits are connected to each other at defined data input and output lines. For example, in FIG. 1a data line 185 carries information from local circuit 181 to local circuit 183.

In a very large integrated circuit device, the clock signals must travel through different distances to get to the different subblocks. The clock signals then travel through different logic circuits within the different subblocks. During this distribution, the clock signals within the different subblocks can become skewed.

If a data signal from one subblock, driven using a first local clock line is sent to a different subblock that is clocked using a second local clock line that is skewed from the first, then the data signal may be clocked too early or too late. For example, if the clock line from the second subblock is delayed more than the clock line from the first subblock then the data signal from the first subblock will be generated and removed before the second subblock is able to sample the data signal line from the first subblock. This is referred to as a race condition.

Figure 1B:
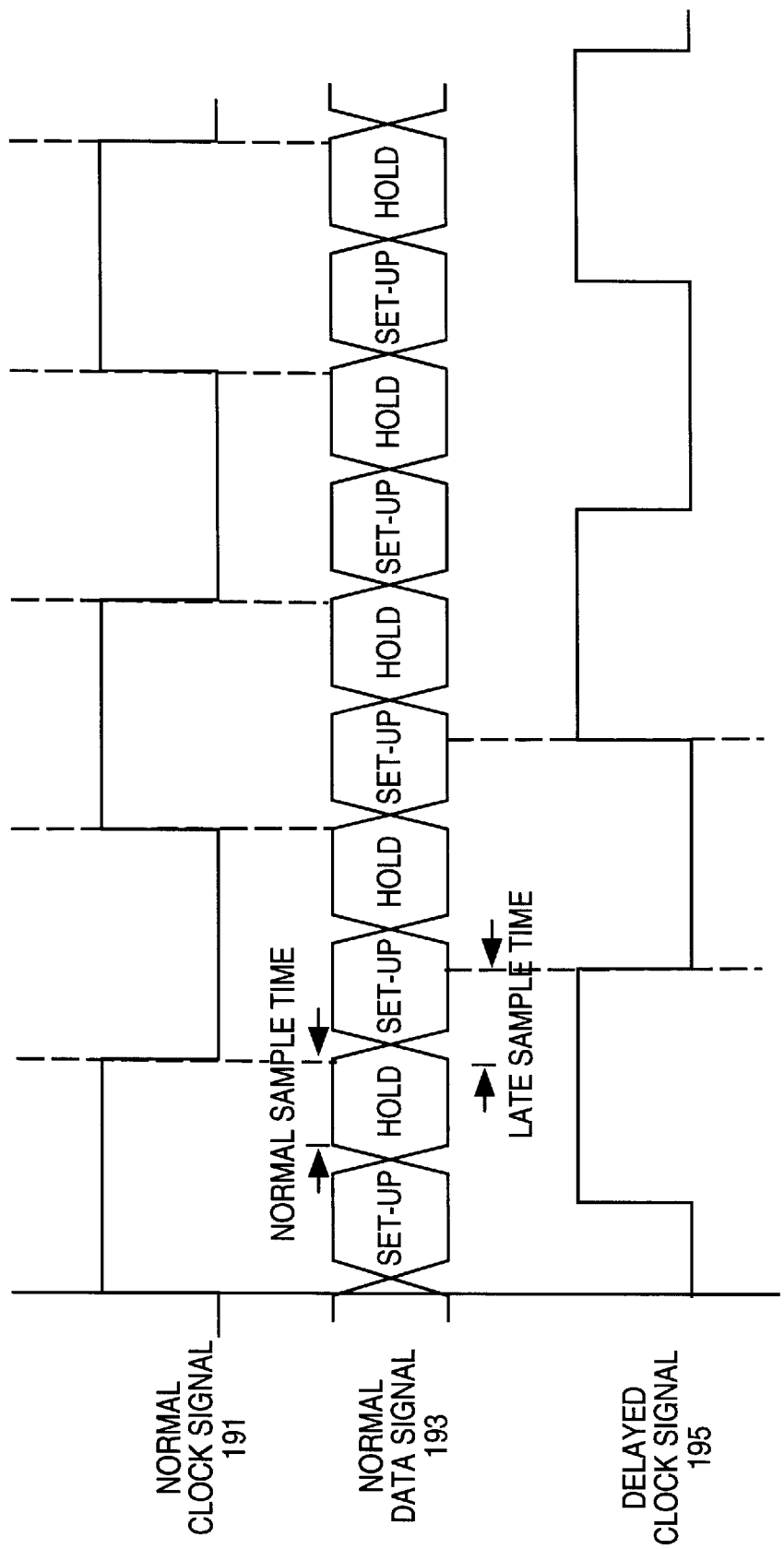
FIG. 1b illustrates a timing diagram of a race condition.

FIG. 1b illustrates an example of a race condition. In FIG. 1b, clock signal 191 represents a normal clock signal. Data signal 193 represents a data signal that is synchronized to clock signal 191. The data signal 193 is generated during the first half of each clock phase, this is referred to as the "setup" period. During the second half of each clock phase, the data signal 193 can be sampled, this is referred to as the "hold" period. In FIG. 1b, the clock signal 195 in the receiving circuit is significantly delayed from the clock signal 191 in the source circuit. As illustrated in FIG. 1a, this causes the receiving circuit to sample the data signal 193 too late. Since the data signal 193 is sampled at the wrong time, incorrect data will be received and thus, the integrated circuit will not function properly.

Existing Local Clock Driver

Figure 2:
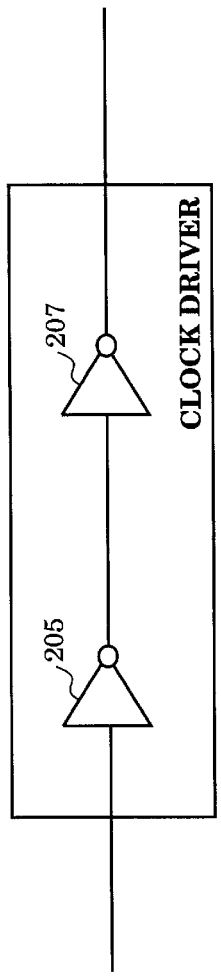
FIG. 2 illustrates a circuit diagram of a prior art clock driver.

As illustrated in FIG. 1a, a complex digital integrated circuit has several clock drivers circuits such as clock driver circuits 120 and 150 that boosts the clock signal within the digital integrated circuit. FIG. 2 illustrates a typical prior art clock driver circuit. The prior art clock driver signal circuit of FIG. 2 simply comprises two (or more) inverters in series. The inverters function to strengthen the clock signal. In a typical prior art clock distribution system, each of the clock drivers comprise the dual inverter clock driver illustrated in FIG. 2.

An Improved Local Clock Driver

Figure 3:
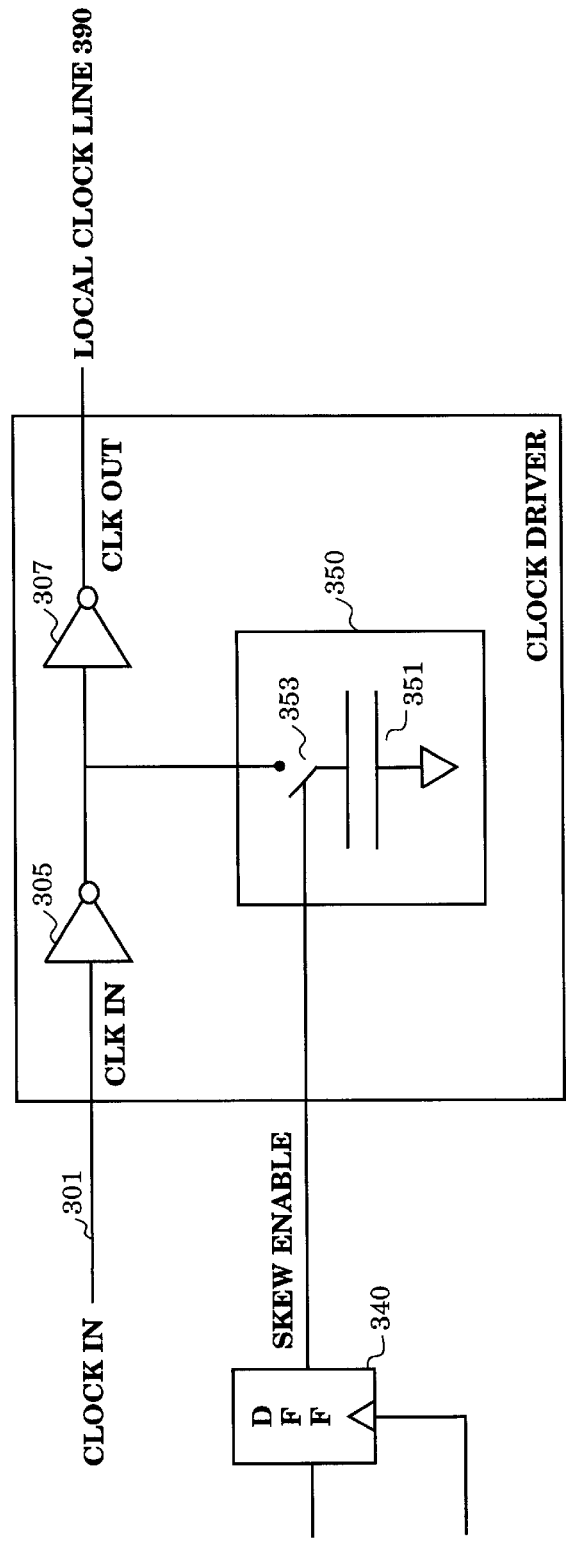
FIG. 3 illustrates a circuit diagram of the clock driver of the present invention.

The present invention comprises a method of introducing skew into various local clock signals such that race conditions can be detected. FIG. 3 illustrates one possible implementation of a local clock driver for use with the present invention. Like the prior art clock driver of FIG. 2, the clock driver of FIG. 3 comprises in part two (or more) inverters 305 and 307 that are in series. However, the clock driver of FIG. 3 also includes a delay circuit 350. The embodiment of FIG. 3 consists of delay circuit 350 comprising a switch 353 and a capacitor 351. Other types of know delay circuits can also be used. The switch 353 is controlled by a D flip flop 340.

The D flip flop 340 controls whether the skew enable is turned on or off. When the skew is disabled, the clock driver of FIG. 3 acts just like the clock driver of FIG. 2. When the skew is enabled, switch 353 is turned on such that the line between the two inverters 305 and 307 is connected through capacitor 351 to ground. When the line between inverter 305 and inverter 307 is connected through capacitor 351 to ground, additional time is required to build up charge before the signal is propagated by inverter 307. Thus, when the skew enable line is asserted, a delay will be added to the clock signal that passes through the clock driver circuit of FIG. 3.

Referring again to FIG. 3, when the skew enable for a local clock driver is enabled such that capacitor 351 is connected to the line between inverter 305 and inverter 307 a small delay will be introduced in the clock driver circuit.

If all of the local clock drivers in a digital integrated circuit are constructed according to the teachings of FIG. 3 then any single local clock circuit can be delayed by setting the D flip flop controlling the skew enable signal to one.

Figure 4:
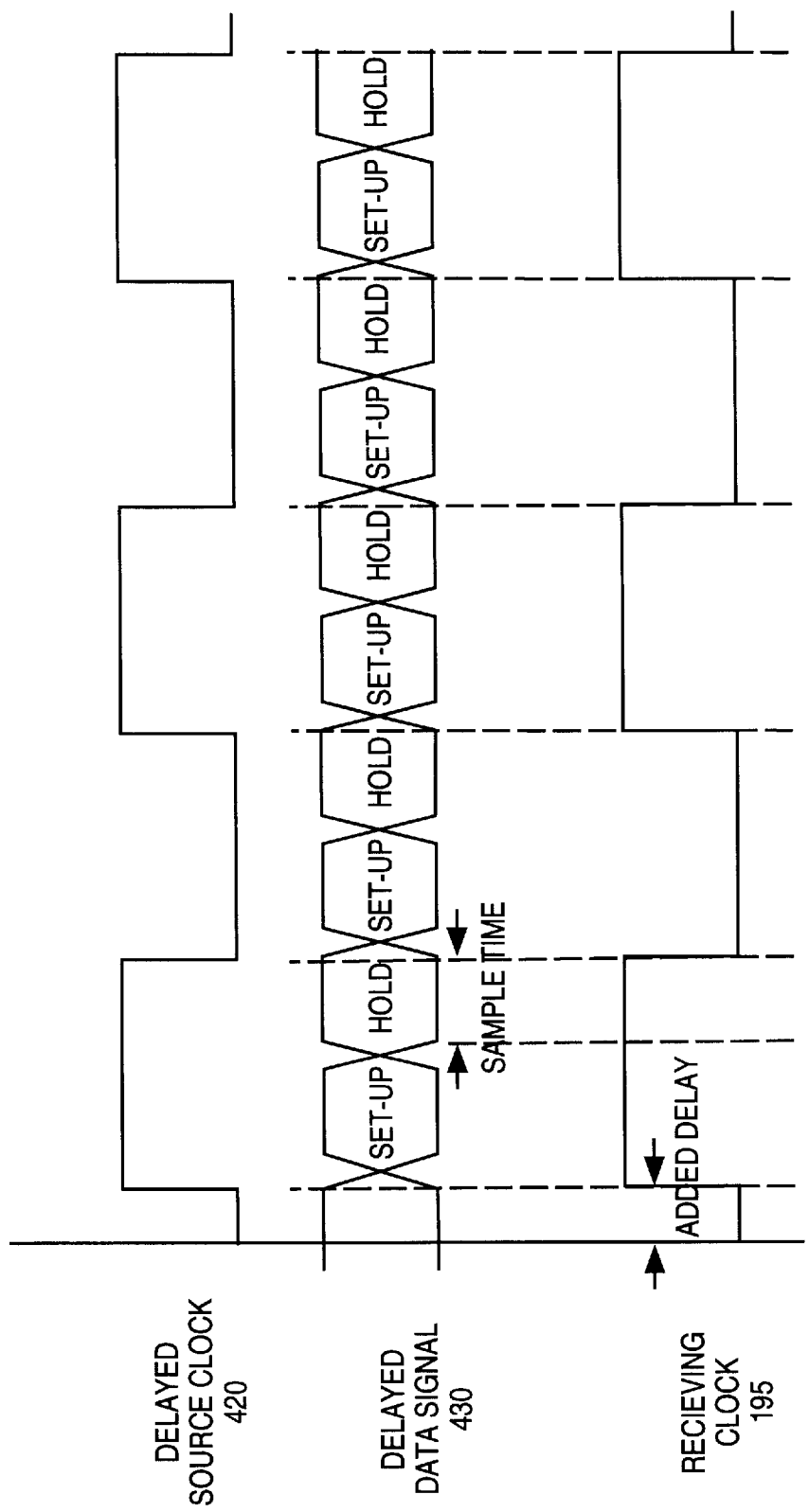
FIG. 4 illustrates a timing diagram of a clock signal and associated data clock that have been delayed by the clock driver of the present invention.

FIG. 4 illustrates a timing diagram that shows how the local clock driver of the present invention can be used to correct a race condition. As illustrated in FIG. 4, the receiving clock signal 195 is the same as in FIG. 1b. However, the source clock signal 420 has been delayed using the local clock driver of the present invention with the clock skew enabled. The data signal 430 is also delayed since the data signal 430 is synchronized to the source clock signal 420. When the delayed a data signal 430 where the local clock driver skew is enabled is transmitted to the subblock where there is natural clock skew then the data signal 430 will be sampled at the proper time. This is clearly illustrated in FIG. 4 where the data signal sampling period for the data signal 430 occurs during the hold period of the data signal.

Locating A Race Condition With The Improved Local Clock Driver

If every local clock driver in a digital integrated circuit contains the skew circuit of FIG. 3 then race condition problems caused by clock skew within the digital integrated circuit can be located. To locate the a race condition problem the following steps are performed:

Step 1.

Turn on the skew enable for one local clock driver in the malfunctioning digital integrated circuit and then test the digital integrated circuit.

Step 2.

If the digital integrated circuit now functions properly, then you have located the source subblock of the race condition. Otherwise, turn on the skew enable for a different local clock driver in the digital integrated circuit and return to Step 2.

Step 3.

Having identified the source subblock of the race condition problem, the receiving subblock of the race condition problem must be found. Keeping the skew enable on for the source subblock, turn on the skew enable for another subblock that receives data signals to the source subblock.

Step 4.

If the digital integrated circuit now malfunctions, then you have located the receiving subblock of the race condition problem. Otherwise, turn on the skew enable for a different receiving subblock local clock driver in the digital integrated circuit and return to Step 4 until the receiving subblock is found.

As specified in the steps above, a person debugging an integrated circuit with the improved local clock drivers must be able to turn the skew enable on and off for all the various local clock drivers. Thus, the digital integrated circuit must be designed such that the skew enable for the local clock drivers are independently addressable.

Figure 5:
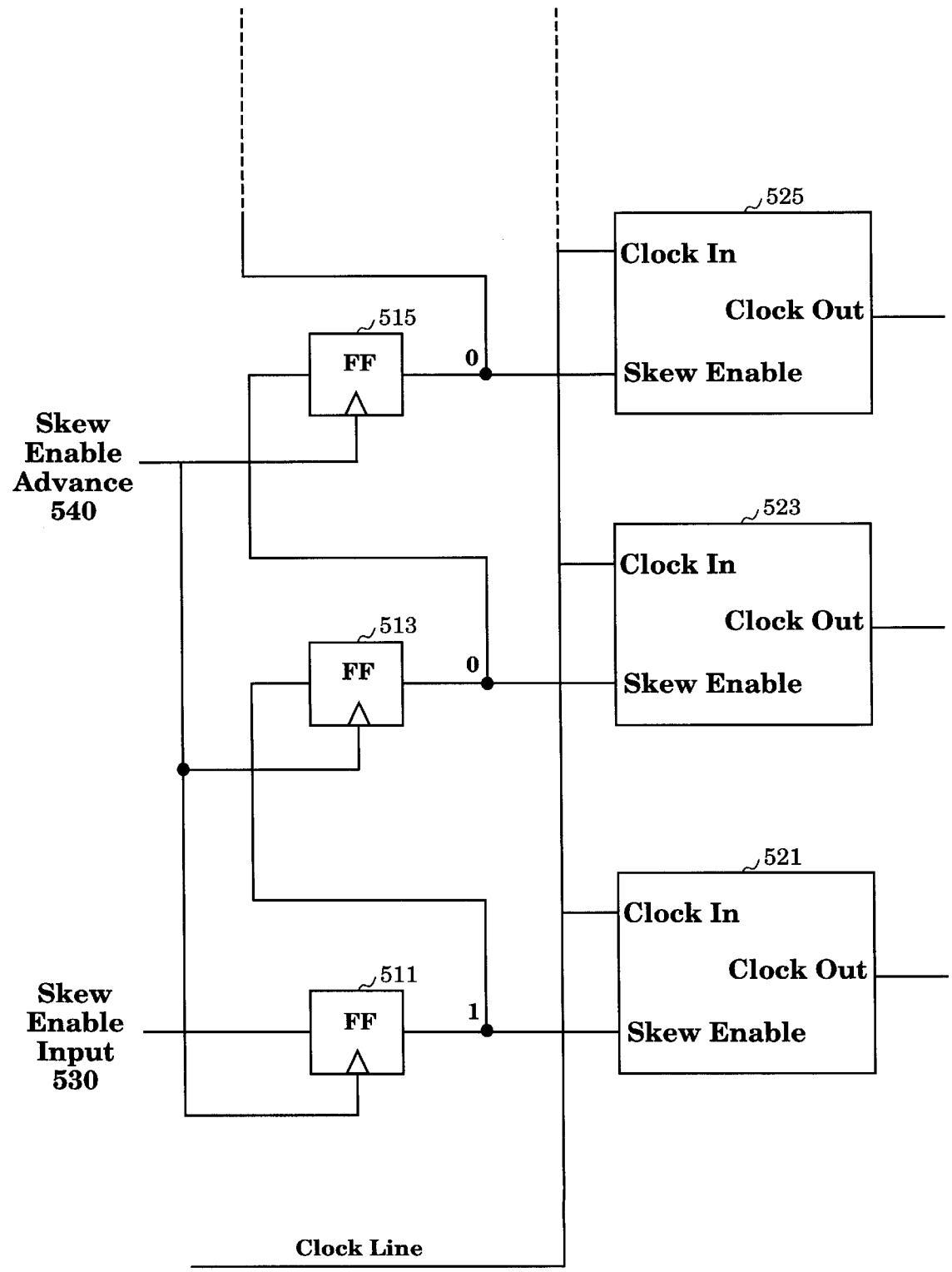
FIG. 5 illustrates a series of local clock drivers coupled to serially controlled flip-flops.

FIG. 5 illustrates one means of solving this problem. FIG. 5 illustrates a set of local clock drivers (521, 523, and 525) coupled to D Flip-Flops (511, 513, and 515 respectively) used to control the skew enable signal. In the circuit in FIG. 5, the data-in and data-out ports of the D Flip-Flops (511, 513, and 515) are connected together serially such that a single skew enable input 530 can be used to set all of the local clock drivers by shifting in data values. The shifting is controlled by Skew Enable Advance 540. A pin on the outside of the integrated circuit can be designated as the clock driver skew enable data input line 530 and a second pin can be designated as the Skew Enable Advance 540. To skew the local clock drivers as needed, the person debugging the integrated circuit simply shifts in the proper binary string that will enable the desired local clock drivers.

After locating the source subblock and receiving subblock of a race condition problem, the integrated circuit designers can examine the integrated circuit and circuit layout to determine if an improved circuit or circuit layout with remedy the race condition.

Compensating for a Race Condition With The Improved Local Clock Driver

The improved local clock driver can be used to compensate for an existing race condition. To compensate for an existing race condition, the designers first use the steps from the previous section to locate the race condition within the digital integrated circuit. After locating the race condition of the digital integrated circuit, the designers then load the flip-flops that control skew enable of each clock driver such that only the flip-flop that controls the skew enable for the source subblock of the critical speed path is enabled. This will give the destination subblock more time to sample the data signal during its hold state. Thus, an integrated circuit with a race condition can be used.

Although the present invention has been described in terms of specific exemplary embodiments, it will be appreciated that various modifications and alterations might be made by those skilled in the art without departing from the spirit and scope of the invention as set forth in the following claims.

What is claimed is:

1. An integrated circuit, said integrated circuit comprising the elements of:

a plurality of circuit subblocks, said circuit subblocks comprising different logic circuits;

a plurality of data lines, said data lines connecting said plurality of circuit subblocks;

a first local clock driver within a receiving circuit subblock for generating a first clock signal, said first local clock driver receiving a delayed reference clock signal; and a second local clock driver within a sending circuit subblock for generating a second clock signal, said second local clock driver receiving a reference clock signal, said second local clock driver comprising a driver circuit for strengthening said reference clock signal;

a delay circuit for delaying said reference clock signal to create said second clock signal;

an enable switch, said enable switch activating said delay circuit such that a delay is introduced in said reference clock signal to produce said second clock signal, and a flip-flop, said flip-flop coupled to said enable switch.

2. The integrated circuit as claimed in claim 1 wherein said delay is introduced into said second clock signal by coupling said reference clock signal to to a capacitor that is coupled to ground.

3. The integrated circuit as claimed in claim 1 wherein said driver circuit comprises the elements of:

a first inverter; and a second inverter, said second inverter coupled in series to said first inverter with a first conductor.

4. A method of locating a race condition in an integrated circuit, said integrated circuit currently malfunctioning, said method comprising the steps of:

delaying a local clock signal in a circuit subblock; and testing said integrated circuit, if said integrated circuit functions properly then said circuit subblock is a source subblock of said race condition, else delay a different local clock signal in a different circuit subblock and repeat said steps of delaying and testing until said integrated circuit functions properly.

5. The method of locating a race condition in an integrated circuit as claimed in claim 4 further comprising the steps of:

delaying said local clock signal in said source subblock;

delaying a second local clock signal in a second circuit subblock; and testing said integrated circuit, if said integrated circuit fails then said second circuit subblock is a receiving subblock of said race condition, else delay a different local clock signal in a different second circuit subblock and repeat said steps of delaying and testing until said integrated circuit fails.

6. A method of correcting a race condition in an integrated circuit, said method comprising the steps of:

locating a source subblock of said race condition in said integrated circuit; and selectively delaying a local clock signal in said source subblock of said race condition.

7. The method of claim 6 wherein said step of locating a source subblock of said race condition in said integrated comprises the substeps of delaying a local clock signal in a circuit subblock; and testing said integrated circuit, if said integrated circuit functions properly then said circuit subblock is said source subblock of said race condition, else delay a different local clock signal in a different circuit subblock and repeat said steps of delaying and testing until said integrated circuit functions properly.

8. The method of claim 6 wherein said step of selectively delaying a local dock driver in a source subblock comprises adding capacitance to said local clock driver.

* * * * *